(12) United States Patent
Steinmeyer et al.

(10) Patent No.: US 8,798,696 B2
(45) Date of Patent: Aug. 5, 2014

(54) SUPERCONDUCTING WIRE WITH LOW AC LOSSES

(75) Inventors: Florian Steinmeyer, Herzogenaurach (DE); Mark Rikel, Hürth (DE); Jürgen Ehrenberg, Hürth (DE); Steffen Elschner, Heidelberg (DE)

(73) Assignee: Nexans, Paris (FR)

( * ) Notice: Subject to any disclaimer, the term of this patent is extended or adjusted under 35 U.S.C. 154(b) by 700 days.

(21) Appl. No.: 12/472,595

(22) Filed: May 27, 2009

(65) Prior Publication Data

US 2010/0197505 A1 Aug. 5, 2010

(30) Foreign Application Priority Data

Jun. 5, 2008 (EP) ..................... 08305235

(51) Int. Cl.
| | | |
|---|---|---|
| *H01B 12/06* | (2006.01) | |
| *H01B 12/02* | (2006.01) | |
| *H01L 39/24* | (2006.01) | |
| *H01L 39/02* | (2006.01) | |
| *H01B 13/00* | (2006.01) | |

(52) U.S. Cl.
USPC ........... 505/230; 505/237; 505/430; 505/433; 505/470; 174/125.1; 29/599

(58) Field of Classification Search
USPC ......... 505/230, 231, 237, 238, 430, 431, 433, 505/470, 704; 427/62; 174/125.1, 15.4, 174/15.5; 428/469, 472, 697, 698, 702; 29/599

See application file for complete search history.

(56) References Cited

U.S. PATENT DOCUMENTS

| | | | |
|---|---|---|---|
| 6,506,439 B1 * | 1/2003 | Usoskin et al. ................. 427/62 |
| 2001/0010113 A1 | 8/2001 | Frohne et al. | |
| 2003/0032560 A1 * | 2/2003 | Otto et al. .................... 505/100 |
| 2004/0266628 A1 * | 12/2004 | Lee et al. ..................... 505/238 |
| 2005/0096322 A1 | 5/2005 | Igarashi | |
| 2005/0181954 A1 * | 8/2005 | Buczek et al. ................ 505/329 |
| 2006/0023826 A1 | 2/2006 | Menkhoff | |
| 2006/0073975 A1 * | 4/2006 | Thieme et al. ................ 505/125 |
| 2007/0145100 A1 * | 6/2007 | Suzuki et al. ................. 228/101 |

FOREIGN PATENT DOCUMENTS

| | | | | |
|---|---|---|---|---|
| DE | 9111328 | | 10/1991 | |
| DE | 19724618 | * | 2/1998 | ............ H01B 13/00 |
| DE | 19724618 | | 12/1998 | |
| EP | 1788641 | | 5/2007 | |
| EP | 1916720 | | 4/2008 | |
| JP | 05-151837 | * | 6/1983 | ............ H01B 12/10 |
| JP | 07-073757 | * | 3/1995 | ............ H01B 13/00 |

OTHER PUBLICATIONS

International Search Report dated Oct. 6, 2008.

(Continued)

*Primary Examiner* — Stanley Silverman
*Assistant Examiner* — Kallambella Vijayakumar
(74) *Attorney, Agent, or Firm* — Sofer & Haroun, LLP

(57) ABSTRACT

A multilayer superconducting wire 7 with essentially round cross sectional area where the outer surface of the round wire is provided with a high temperature superconductor layer 3 and where at least the high temperature superconductor layer 3 is fabricated as a spiral running along the length of the superconductor wire 7 in parallel lanes 15.

15 Claims, 10 Drawing Sheets

(56) References Cited

OTHER PUBLICATIONS

Time-Varying Fields and A.C. Losses, M.N. Wilson, 1983, ISBN 0-19-854810-9, pp. 159-197.

AC Loss Analysis for Superconducting Generator Armatures wound with Subdivided Y-Ba-Cu-O coated tape, Cryogenics, V41 (2), 2001, pp. 117-124.

High-Performance YBCO-Coated Superconductor Wires MRS Bulletin/Aug. 2004, pp. 533-541.

* cited by examiner

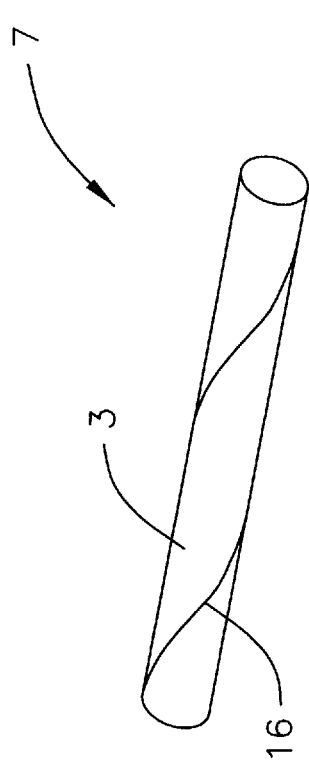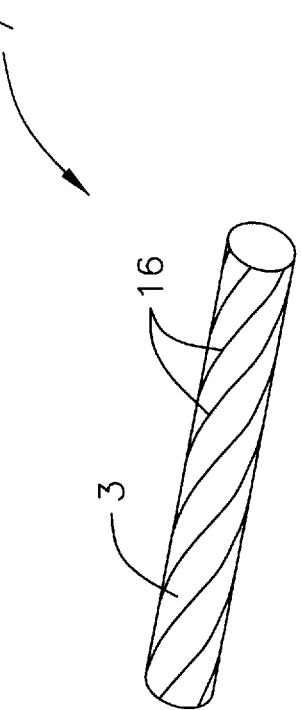

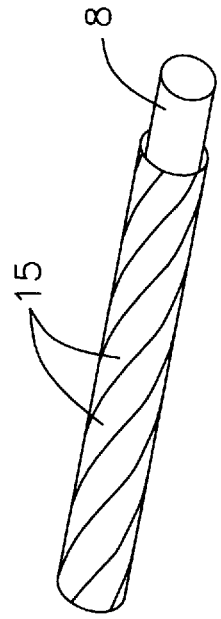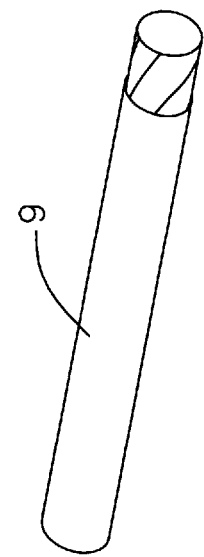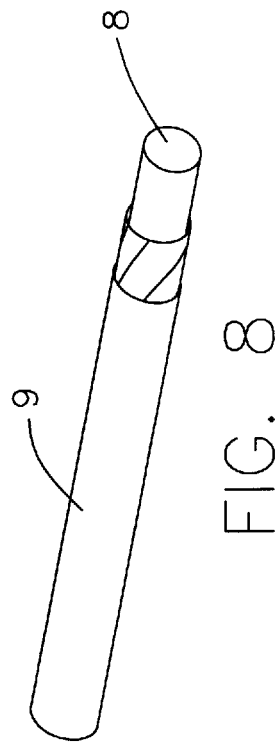

SUPERCONDUCTING WIRE WITH LOW AC LOSSES

RELATED APPLICATION

This application claims the benefit of priority from EP 08 305 235.7, filed on Jun. 5, 2008, the entirety of which is incorporated by reference.

BACKGROUND

1. Field of the Invention

The present invention relates to a multilayer superconducting wire composed of a substrate of long length, such as a tape, onto which a layer of super-conducting material is deposited.

In particular the present invention relates to such a multilayer superconducting wire also referred to as "coated conductor" and having an essentially round cross section.

2. Related Art

Superconducting wires are known to carry DC currents of extraordinary high current density with very low losses. For many application in the energy industry there is a need to carry large AC currents of typically 50 Hz or 60 Hz frequency.

There are a number of known loss mechanisms in superconductors, which effectively lead to dissipation of heat in a superconducting wire. As superconductors are used at very low temperatures (typically 4.2 K, liquid Helium, for Low Temperature Superconductors, "LTS", or up to 77 K, the temperature of boiling liquid nitrogen, for High Temperature Superconductors, "HTS"), any dissipation is penalized by the need to use a refrigerator to pump the heat losses from cryogenic temperature to room temperature. Dissipation of 1 W at 77 K typically requires a 10 W power input of a refrigerator to remove these losses.

Nowadays there are known a plurality of different configurations of superconductors, the configuration being varied in view of the intended application field.

For example, DE 197 24 618 A1 discloses a tubular superconductor composed of a support layer made of a metal, an adhesion layer and provided onto the adhesion layer a metal foil onto which is applied a superconducting layer. The multilayer tube has a corrugated wave like shape and can be used in high frequency cables.

German utility model G 91 11 328 U1 relates to a superconductor tape wherein onto a metal support tape a number of individual superconducting filaments are arranged in parallel to each other and extending along the length of the metal support tape. The individual superconducting filaments are electrically connected to each other by superconducting contacts which are provided in distinct intervals and which bridges adjacent filaments. According to one embodiment it is proposed to wind the assembly helically onto a core.

DE 100 45 065 A1 relates to a process for applying a superconducting layer onto a metal carrier tape by pulsed laser deposition. For enhancing the deposition efficiency it is suggested winding the metal carrier tape onto a metal pipe during deposition, wherein the metal pipe is rotated when passing the deposition chamber.

US 2005/0181954 A1, generally, relates to superconducting cables composed of coated conductor tapes which can be helically wound around a support mandrel. The coated conductor tapes are composed of at least a metal carrier tape, one or more buffer layers and a superconducting layer. According to some embodiments stacks of such coated conductor tapes are used, wherein two or more coated conductor tapes are stacked on top of each other.

In many potential applications high currents are needed, often at high magnetic field levels. Examples include superconducting high or medium voltage power transmission cables, fault current limiters, transformers, magnets (e.g. for magnetic resonance imaging) and synchronous motors with superconducting windings. Even in applications with DC currents (DC magnets, synchronous motors), losses occur during field changes, when currents are ramped sometimes very quickly. These losses can be so high, that heat build-up in a component heats the winding to above its safe operating limit causing the device failure. AC losses are therefore the key bottleneck to the wider application of HTS superconductors, often limiting the economic justification of superconductors or even completely rendering an application impossible.

AC loss mechanisms in superconductors are well understood (see, e.g., M. N. Wilson, Superconducting Magnets, Clarendon Press, Oxford, 1983, ISBN 0-19-854810-9, pages 159-197). Three major mechanisms are:

(1) Eddy current losses in normal metals caused by time varying magnetic fields. Normal metal is used in every technical superconducting wire as a base or matrix material stabilising a superconductor mechanically and electrically.

(2) Hysteretic losses in the superconductor are caused by magnetic flux lines (vortices) entering and leaving the superconductor as it swings through an AC cycle. In a simplified model losses are proportional to the change in magnetization $\Delta M \sim J_c \times r$, where $J_c$ is the critical current, and $r$ is the characteristic size of superconductor. The hysteretic losses can be reduced by breaking up the superconductor into small filaments, and bundling the filaments in a metallic matrix. This approach is well known and efficient in Low Temperature Superconductors (LTS), whereas, for example, thin filaments (from submicron thickness up to about 100 μm, depending on application) of Niobium-Titanium wire are embedded in a Copper matrix. This is called a composite wire.

(3) Coupling losses occur in composite wires due to eddy currents in the matrix effectively short circuiting the superconducting filaments. In effect this very much reduces the positive effect of splitting up a superconductor into filaments in the first place. As an effective countermeasure against coupling losses, the composite wire is twisted along its length with a twist pitch on the order of centimeters. Thus filaments change position in the ac field and the inductive voltage caused by eddy currents in the superconductor is changing sign with twist pitch length, effectively zeroing out this loss contribution.

While twisting works well in ductile metallic superconductors (mostly LTS), ceramic oxide superconductors based on the most promising composition YBCO ($YBa_2Cu_3O_7$, or more generally ReBCO, where Re stands for a rare earth element) cannot be drawn into wires but are fabricated by layer deposition processes on planar carrier tapes, usually metallic carrier tapes.

FIG. 1 shows an example of a state-of-the-art tape. The carrier tape 1 (e.g. stainless steel, Hastelloy, Ni or NiW alloys) is coated with buffer layers 2 (typically a sequence of oxide insulator layers such as MgO, yttria stabilized zirconia (YSZ), $CeO_2$, $La_2Zr_2O_7$ (LZO) or other in a plurality of physical or chemical deposition processes (see, e.g., M. P. Paranthaman and T. Izumi, MRS Bull. 29, 533-536 (2004)). The buffer layer(s) protecting HTS from interactions with metallic carrier, are grown to have a texture of its crystal lattice matching single crystalline, a-b crystal axis oriented YBCO as closely as possibly.

As the next step, YBCO layer 3 is coated onto the buffer 2 again in a wide variety of physical or chemical deposition processes, e.g. metalorganic chemical vapour deposition (MOCVD), thermal evaporation, metal organic deposition (MOD), and other.

In a technical conductor very often further layers 4 are deposited (e.g. metals like Cu, Ag, Au, typically by electrocoating) that serve to protect the YBCO layer against mechanical, chemical or electrical damage (e.g. as a shunt) in a given application. The shunt layer typically protects the conductor against thermal run-away and burn-out in case that one part of the superconductor became normal and developed a high resistance.

Such tape-like thin film superconductor—often also referred to "coated conductors" or "second generation HTS wire"—and processes for manufacturing are well known in the art and are widely described.

The problem here is that, typically buffer layer(s) and ceramic oxide superconductors such as YBCO cannot withstand mechanical deformation beyond narrow limits without damage.

There have been various attempts in the art to reduce AC losses in tape conductors. FIG. 2 shows an example, where the superconductor layer has been broken up into four strips or filaments 5 to reduce hysteretic losses. A metallic shunt layer 4 is coating the outside of the conductor (FIG. 3). Unfortunately, this solution does not effectively reduce losses, as coupling losses through the connective coating remain dominant.

It has been proposed to twist the tape around its length (C. E. Oberly et al., Cryogenics 41, 117-124 (2001)). As a practical conductor suitable for winding a coil this is ineffective, as the twists build up conductor thickness like a tie and thus do not fill space efficiently and make winding a coil or other components therefrom nearly impossible.

In WO2006/023826 A2 the tape is structured such that filamentary lines of superconductor run from one side of the tape to the other in a shallow angle. In order to return to the other side, mimicking twist, a short superconducting link is bridging over all intermediate filaments in a second layer with insulation in between. This, being an efficient reduction of losses, is a challenging production process.

In a further known solution disclosed in WO2005/096322 A1, a wide superconductor tape is cut into smaller width in an elongated zig-zag pattern. A number of these tapes are then formed into the so-called Roebel cable. While this reduces losses in a wide tape efficiently, the width of each tape is still a couple of millimeters, thus not reducing losses far enough for many applications.

It was the object of the present invention to provide such a superconducting wire wherein the superconducting wire has reduced AC losses and is obtainable in a simple and efficient manner.

This object is solved by a superconducting wire composed of a tubular carrier tape provided with a HTS layer wherein the HTS layer is fabricated as a spiral running around the longitudinal axis of the superconducting wire and wherein at least one buffer layer is provided between tubular carrier tape and HTS layer.

In particular, according to the present invention the superconductor layer is composed of one or more stripes which run helically around a tubular substrate, that is the superconductor layer is applied onto the tubular substrate in helical configuration.

It is the intention of the invention to reveal the geometry of the superconducting wire as well as methods to produce the wire efficiently.

Typically, the carrier tape is a metal or metal alloy tape. The tape can be textured such as obtainable by the well-known RABIT process.

According to need one or more buffer layer(s) can be provided between the carrier tape and the HTS layer. Suitable metals, metal alloys and buffer layer(s) are generally known and can be used for the present invention.

For the carrier tape as well as for the buffer layer(s) those referred to above with respect to the prior art can be used.

Generally, any ceramic oxide HTS can be used for the present invention.

The HTS material may be of ReBCO-type with Re being at least one of selected from La, Ce, Pr, Nd, Pm, Sm, Eu, Gd, Tb, Dy, Ho, Er, Y, Tm, Yb and Lu with Y being preferred. Preferably, the HTS material is $ReBa_2Cu_3O_7$ with Re being as defined above.

The buffer layer(s) and HTS layer typically are provided on the outward face of the tubular carrier tape. The HTS layer is patterned into one or more screw lines, in the following also referred to "lane", snaking around the length of the wire with a width and twist pitch that in can be optimized according to the application.

In particular, with the present invention it is possible to obtain lanes of superconductor material with very small width.

BRIEF DESCRIPTION OF THE DRAWINGS

The principle of the present invention is now illustrated by reference to the accompanying figures and a preferred embodiment using YBCO for the HTS layer.

It is shown in

FIGS. 4 to 8 various embodiments of the superconducting wire according to the present invention;

DETAILED DESCRIPTION

Figure 1:
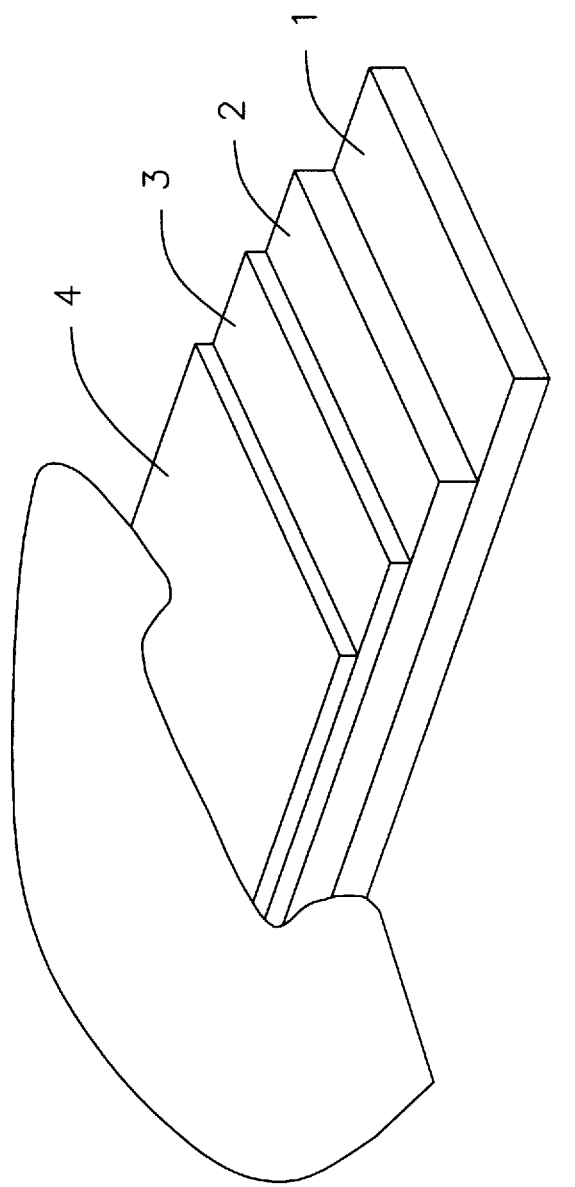
FIGS. 1 to 3 HTS thin-film conductor tapes according to the prior art.
Figure 2:
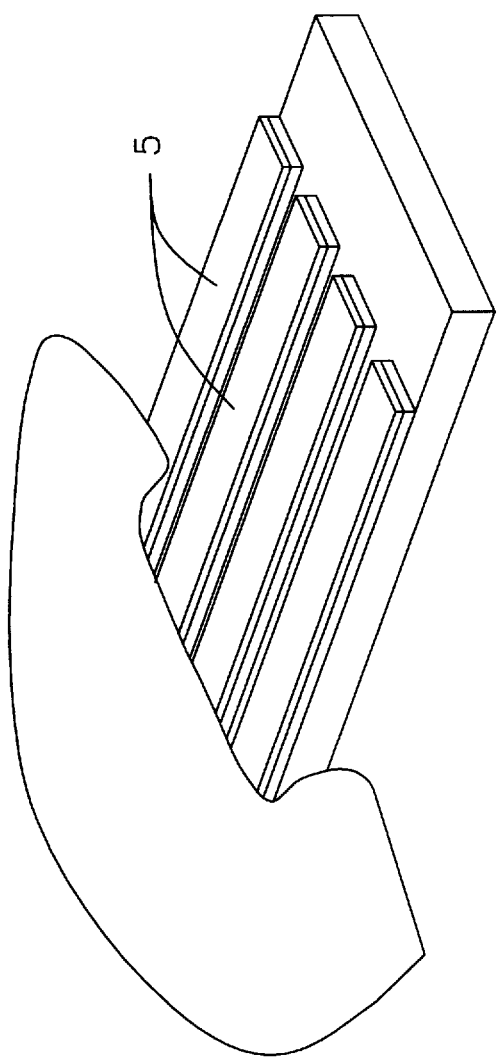
Figure 3:
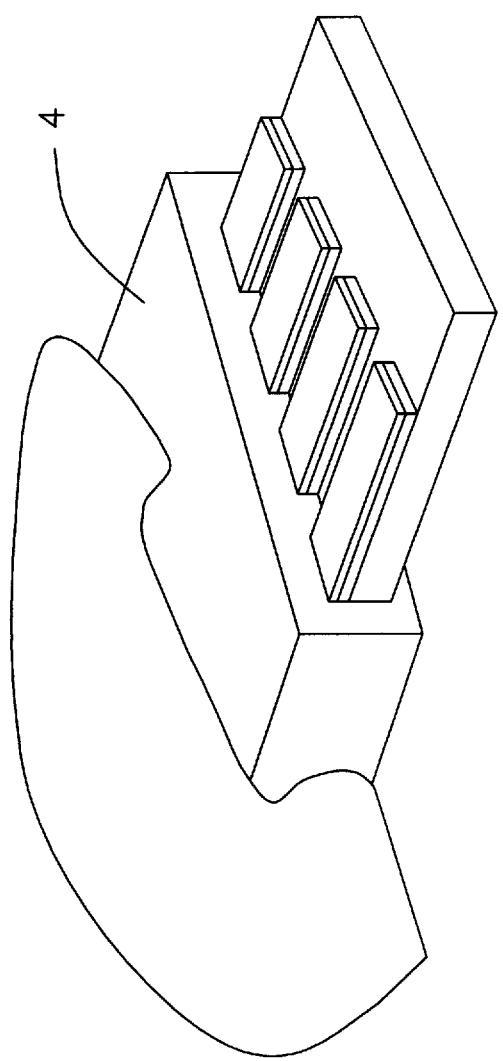

FIGS. 4 and 5 show two examples of the superconducting wire 7 of the present invention.

As can be seen in FIGS. 4 and 5 the superconducting wire 7 has essentially a round (tubular) shape with the HTS-layer 3 being provided on the outer surface. The HTS layer 3 is patterned into a screw line snaking around the length of superconductor wire 7.

The width and twist pitch of the spiral pathway can be optimized according to the need of the respective application.

As shown in FIG. 6 the HTS-layer 3 can be patterned into one or more parallel lanes 15 snaking around the length of the wire side by side.

According to the present invention very small widths of the lanes are obtainable.

By the provision of individual lanes the HTS superconductor is separated into smaller filaments wherein for reducing AC losses adjacent filaments (e.g. lanes) are not in contact with each other. Consequently, a gap 16 is formed between adjacent lanes 15.

For the present invention the width of the gap 16 is not particularly critical.

Generally, for AC losses the width of the gap could be important if it is comparable to the wave length.

For AC applications with frequencies of about 100 Hz, typically 50 to 60 Hz, consequently the size of the gap is not critical provided that physical contact between adjacent lanes or adjacent windings of the superconductor layer is avoided.

The gap 16 can have a width of from some nm to some mm, in particular of from about 10 nm to 2 mm. There is no particular restriction to the minimum width of the gap 16 which, thus, depends from the limitations of the manufacturing techniques only. Nowadays gaps with a width of about 10 nm are obtainable.

For practical reasons suitable width for the gaps can be in the range of from about 50 microns to 2 mm.

As shown in FIG. 6 the superconducting wire 7 can be formed around a central core wire 8, e.g. made of a metal, for providing a mechanically stabilizing core and/or a metallic shunt. Preferably the central core wire (8) is made of a highly electrically conductive metal, such as copper, aluminum or alloys thereof.

The superconducting wire of the present invention has an essentially round cross sectional area.

"Essentially round" means that the cross sectional area of the superconducting wire 7 can also be elliptical with a round cross sectional area being preferred.

As shown in FIGS. 7 and 8, the superconducting wire 7 with or without central core wire 8, can be protected by further layer(s) (9) typically provided on the HTS layer, for example a metallic coating, an insulator layer etc.

For example, the insulator layer can be formed by extrusion of known insulators like polyester, polyetheretherketone (PEEK) etc.

It is a further object of the invention to provide manufacturing methods for the superconductor wire 7. Examples are outlined in FIGS. 6, 7, 8, 9, 10, 11, 12, 13, 14.

Figure 9:
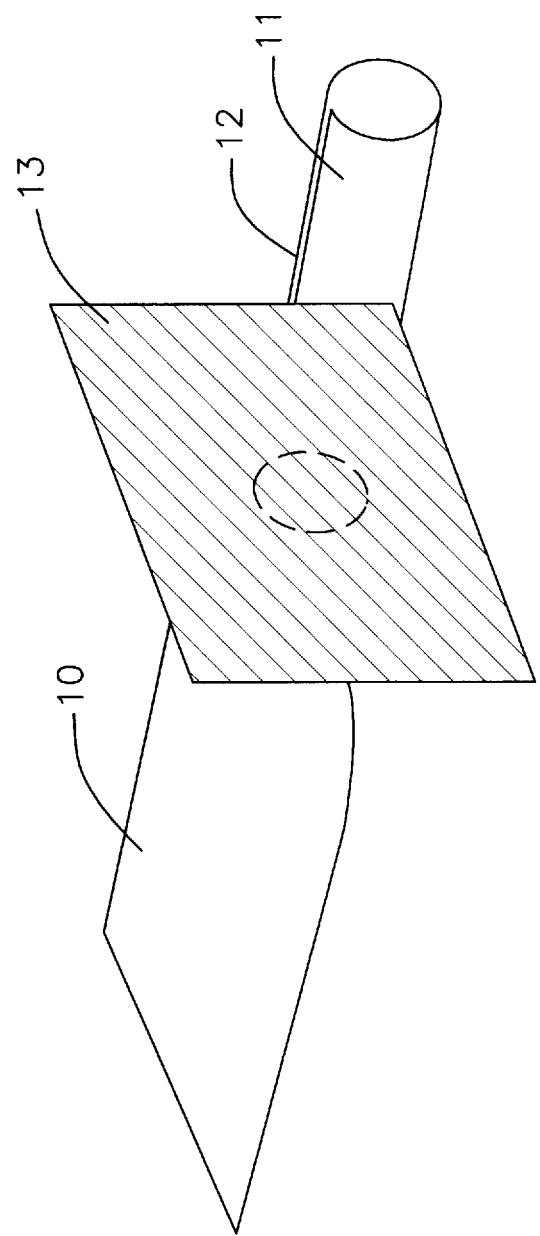
FIGS. 9 to 14 examples of manufacturing methods of the superconducting wire of the present invention.

As shown in FIG. 9, the basic form of the present superconducting wire 7 is obtainable by drawing a planar tape 10 through a drawing die 13 in order to form an essentially round tape also referred to "tubular tape" with a split 12.

To this, the tape can be formed to tubular shape by forming the tape along its longitudinal direction to a split tube with the longitudinal edges adjoining each other along the longitudinal split 12 formed on deformation.

Forming of the tape can be carried out around a central core 8 of essentially tubular or wire shape. The central core 8 is preferably made of a metal such as steel etc.

The obtained tube with central core can be drawn until the tube closely abuts on the central core.

For forming and drawing forming techniques can be applied generally known for the working of metal sheets and metal tapes. In general, manufacturing of tubular coated conductors is known from EP 1 916 720 A1 which is included herein by reference.

Figure 10:
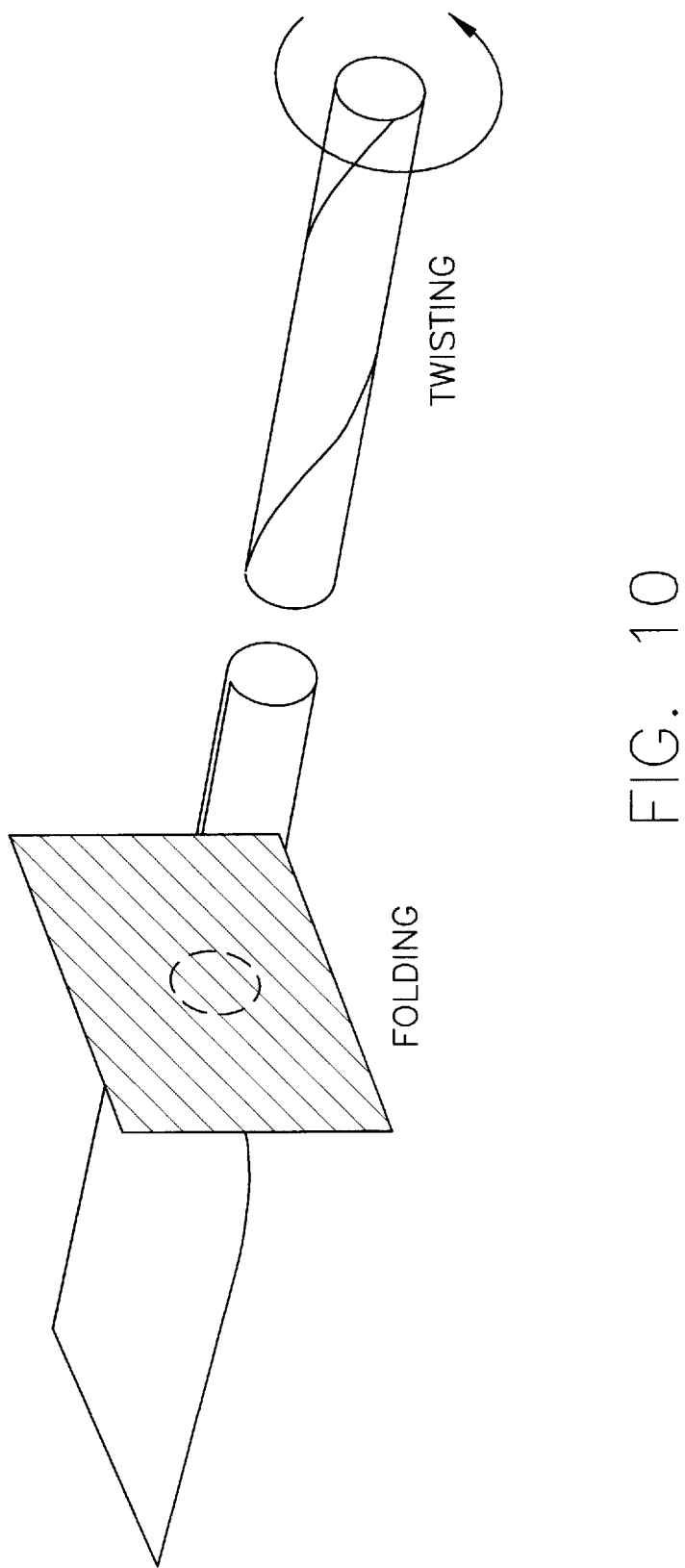

The obtained tubular tape 11 can be twisted around its longitudinal axis for obtaining the spiral pattern as shown in FIG. 10. By this process lane 15 is immediately formed.

For twisting heads can be used which are generally known in wire manufacturing and cabling.

As an optional step the split 12 in the tubular tape 11 can be closed by welding, giving extra stability to the round wire formed. Also the welding step can be used to connect the carrier material of the tape, e.g. stainless steel, with the central core wire 8, e.g. made from copper. Copper and stainless steel can be joined by known welding processes.

According to the present invention, the tape 10 is mostly transformed in its lateral direction in the flat-to-round transformation. This is in particular beneficial for any buffer and/or HTS layer deposited prior to the transformation, as the superconducting properties of the HTS layer such as the YBCO layer, may suffer severely under deformation e.g. bending along the tape (due to cracks forming that preferably will run in the lateral direction).

In practice, some damage to the buffer layer may occur during shaping transformation. Therefore, coatings can be applied before and/or after the mechanical transformation. For example, it is possible to coat the tape once before the transformation with one or more buffer layer(s), transform, and then coat with at least one more buffer layer, effectively annealing any damage formed in the initially deposited buffer layer.

For the YBCO coating of a round wire chemical processes are particularly favoured, as most physical deposition processes work best single sided on a flat surface. They can, however, also be adapted for a round wire.

In a further fabrication route, the planar tape 10 is transformed into the tubular tape 11 in the drawing die 13, but not twisted as shown in FIG. 9. Instead, the split 12 is welded and the tubular tape 11 is coated with buffer and YBCO layers. Alternatively, the tape is precoated with buffer and after welding recoated. The YBCO layer 3 is then structured into a spiral e.g. by mechanical cutting, scratching, spark erosion, water jet or laser cutting.

Figure 11:
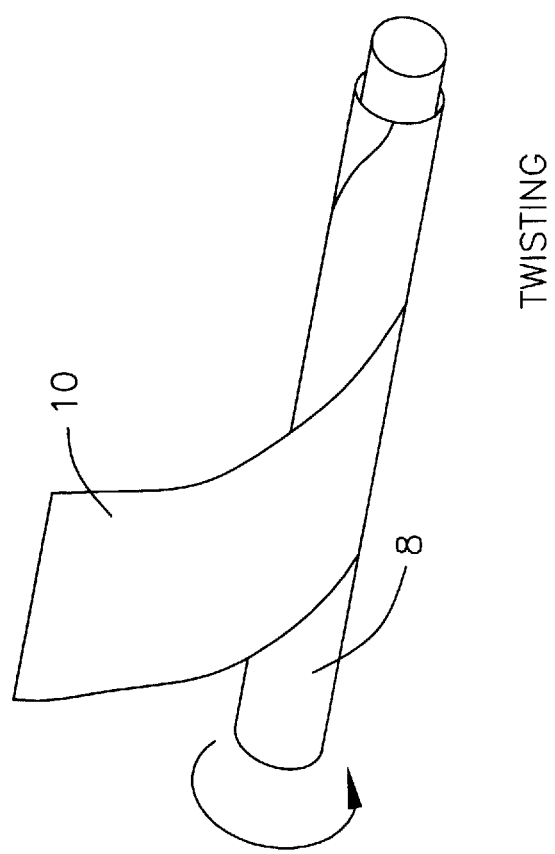
Figure 12:
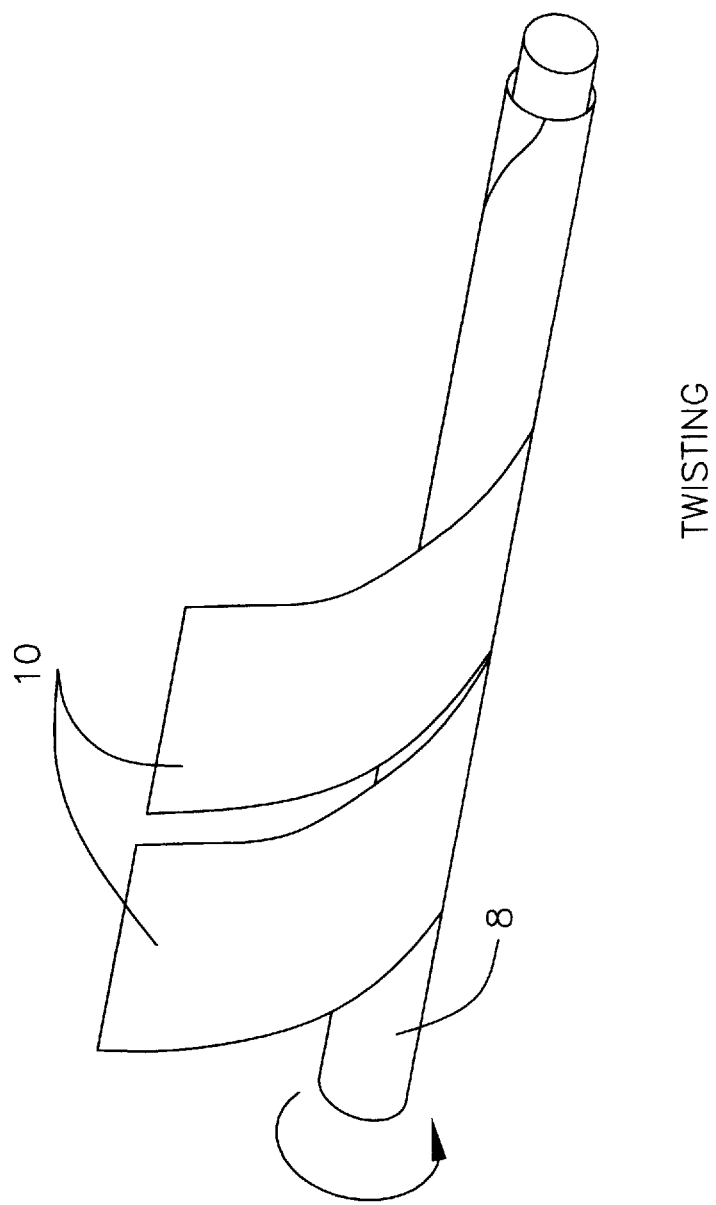
Figure 13:
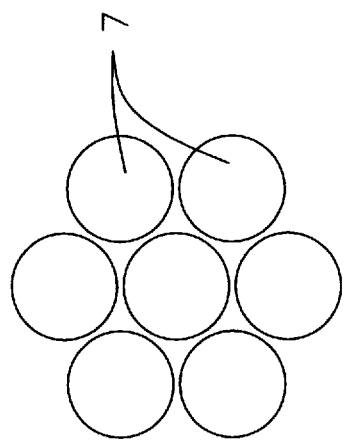
Figure 14:
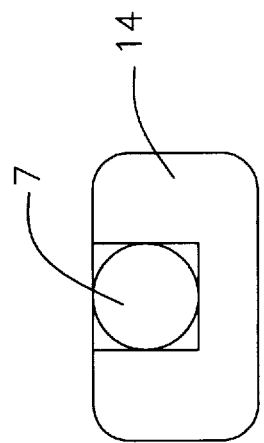

In a further fabrication route, one or more planar tapes 10 are coiled into a spiral, preferably around a central carrier or guide wire (FIGS. 11 and 12). This will bend the tape to a very small radius, so any YBCO layer of currently known processing would be likely to be destroyed by deformation. Hence, for this manufacturing route, processes for coating buffer and HTS layers after shaping to round wire are favoured.

The planar tape(s) 10 can be spirally wound onto a central core wire 8.

According to a preferred embodiment the superconducting wire comprises a textured substrates such as of NiW, and YBCO layer.

For a typical embodiment preferably a biaxially textured tape is used which preferably has a thickness in the range of from 50 µm to 150 µm.

Preferably the thickness of the HTS-layer such as YBCO-layer, is in the range of from 1 µM to 5 µm. And, optional, central core wire preferably can have an outer diameter ranging of from 0.5 mm to 3.0 mm.

Each of the above manufacturing wire routes can be combined with application of one or more further protective metallic or insulating layer(s) 9 according to need.

The essentially round superconductor wire produced in this invention can be very efficiently processed in well-known production process with existing machinery (e.g. coil winding machines). Also, the wire can be further processed into well-known compound conductors, e.g. a twisted multistrand cable (FIG. 13) or as a wire-in conduit conductor (FIG. 14), where additional stabilization is added by e.g. soldering the superconducting wire into a U-shaped metal profile wire 14, usually made of copper.

Preferably the production process comprises at least a twisting step, wherein the tubular tape, optionally already provided with further layers, e.g. superconductor layer, buffer layer(s), is twisted around its longitudinal axis.

Different routes for manufacturing the superconductor wire of the present invention are outlined below labeled "manufacturing 1" two "manufacturing 6".

Manufacturing 1
    start with planar tape
    coat with buffer(s)
    fold round; optionally fold around a central core wire
    twist optionally: weld joint and/or contact central core wire through weld and/or contact central core wire through soldering
coat with second or additional buffer(s)
coat with superconductor
structure superconductor into narrow lanes
optionally: coat with metallic shunt and/or with insulator Manufacturing 2
start with tape
coat with buffer(s),
structure buffer(s) into narrow lanes
fold round, optionally fold around central core wire
twist
optionally: weld joint and/or contact central core wire through weld and/or contact central core wire through soldering
optionally: coat with second or further buffer
coat with superconductor
optionally: coat with metallic shunt
optionally: coat with insulator Manufacturing 3
start with tape
coat with buffer(s)
coat with superconductor
fold round; optionally fold around a central core wire
twist
optionally: weld joint and/or contact central core wire through weld and/or contact central core wire through soldering
structure into narrow lanes
optionally: coat with metallic shunt
optionally: coat with insulator.

Manufacturing Process 4
start with tape
coat with buffer(s)
coat with super conductor
fold around; optionally fault around a core wire
twist
structure into narrow lanes
optionally: well joint and/or contact core wire through weld and/or contact central core wire through soldering
optionally: coat with metallic shunt
optionally: coat with insulator Manufacturing Process 5
start with planar tape
coat with buffer(s)
coat with superconductor
structure into narrow lanes
fold round; optionally fold around central core wire
twist
optionally: weld joint and/or contact central core wire through weld and/or contact central core wire through soldering
optionally: coat with metallic shunt
optionally: coat with insulator Manufacturing Process 6
start with planar tape
optionally coat with buffer(s)
fold round; optionally around central core wire
weld joint; optionally contact central core wire through weld and/or contact central core wire though soldering
coat with buffer(s);
coat with superconductor
structure into twisted lanes
optionally: coat with metallic shunt
optionally: coat with insulator According to the present invention at least the superconductor layer is structured into twisted lanes, i.e. fabricated as a spiral.

The lanes formed from the superconductor layer typically run in parallel side by side.

The present invention relates to a multilayered superconductor wire 7 with essentially round cross section wherein one of the layers is a high temperature superconductor layer and wherein at least the high temperature superconductor layer 3 is fabricated as a spiral running along the length of the superconductor wire 7 in parallel lanes 15.

The invention claimed is:

1. Multilayer superconducting wire comprising:
a tubular carrier tape provided with a superconductor layer, wherein the superconductor layer is fabricated as a lane running spirally along the length of the tubular tape and, at least one buffer layer is arranged between the tubular tape and the superconductor layer, and wherein said multilayer superconducting wire has an essentially cross sectional area.

2. Multilayer superconducting wire according to claim 1, wherein the superconductor layer is separated into two or more lanes and wherein the spiral is formed by arranging the two or more parallel lanes side by side.

3. Multilayer superconducting wire according to claim 1, further comprising a central core wire.

4. Multilayer superconducting wire according to claim 3, wherein the core wire is made of a highly electrically conductive material.

5. Multilayer superconducting wire according to claim 1, wherein the layers are provided onto the outer surface of said tubular carrier tape.

6. Multilayer superconducting wire according to claim 2, wherein said lanes are separated by a gap.

7. Process for manufacturing a multilayer superconducting wire comprising the steps of:
1) forming a planar tape into a tube-shaped tape;
2) twisting the obtained tube-shaped tape of step 1;
3) providing a superconductor layer onto the outer surface of the tube-shaped tape; and
4) structuring the superconductor layer into lanes running spirally along the lengths of the superconductor wire, wherein subsequent to step 1 and prior to step 2 or subsequent to step 2 and prior to step 3 one or more buffer layer(s) are provided or wherein both subsequent to step 1 and prior to step 2 and subsequent to step 2 and prior to step 3 one or more buffer layer(s) are provided.

8. Process according to claim 7, wherein the planer tape is folded around a central core wire into the tubular tape.

9. Process according to claim 7, wherein the planar tape is drawn through a drawing die in order to form the tubular tape.

10. Process according to claim 7, wherein the split left between the longitudinal edges of the basic planar tape on forming into a tubular tape is closed by a weld.

11. Process according to claim 7, further comprising at least one of the following steps
i) contacting central core wire through weld; and
ii) contacting central core wire through soldering.

12. Process according to claim 7, wherein onto the superconductor layer one or more further layer(s) selected from shunt layer, insulator layer and protective layer is provided.

13. Process for preparing a multilayer superconducting wire comprising the steps of:
coating a planar tape with at least one buffer layer;
structuring at least the uppermost buffer layer into parallel lanes;

forming the planar tape into a tubular tape with the surface with the buffer layer(s) being directed outward;

twisting the resulting tubular tape;

optionally providing one or more further buffer layer(s); and coating with superconductor, wherein said multilayer superconducting wire is provided with an essentially round cross sectional area.

14. Process for preparing a multilayer superconducting wire comprising the steps of:

1) coating a planar tape with at least one buffer layer;
2) coating with superconductor layer;
3) forming the resulting coated planar tape into a tubular tape with the coatings being directed outward;
4) twisting the resulting tubular tape, wherein either subsequent to step 2 or subsequent to step 4 at least the superconductor layer is structured into lanes wherein said multilayer superconducting wire is provided with an essentially round cross sectional area.

15. Process for preparing a multilayer superconducting wire comprising the steps of:

optionally coating a planar tape with at least one buffer layer;

forming the planar tape into a tubular tape;

coating with one or more buffer layer(s);

coating with superconductor layer; and structure at least the superconductor layer into twisted lanes wherein said multilayer superconducting wire is provided with an essentially round cross sectional area.

\* \* \* \* \*

UNITED STATES PATENT AND TRADEMARK OFFICE
CERTIFICATE OF CORRECTION

| | |
|---|---|
| PATENT NO. | : 8,798,696 B2 |
| APPLICATION NO. | : 12/472595 |
| DATED | : August 5, 2014 |
| INVENTOR(S) | : Steinmeyer et al. |

It is certified that error appears in the above-identified patent and that said Letters Patent is hereby corrected as shown below:

In the Claims

Column 8, Claim 1, Line 20: In between the words "essentially" and "cross" the word --round-- should be inserted.

Signed and Sealed this
Fourteenth Day of October, 2014

Michelle K. Lee
*Deputy Director of the United States Patent and Trademark Office*